United States Patent
Suzuki et al.

(10) Patent No.: US 8,342,872 B2
(45) Date of Patent: Jan. 1, 2013

(54) SOCKET HAVING TWO PLATES FOR HOLDING CONTACT PINS AND AN URGING MEMBER FOR URGING THE PLATES TOGETHER

(75) Inventors: Satoru Suzuki, Saitama (JP); Shin Kobayashi, Saitama (JP); Yuki Ueyama, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 13/218,951

(22) Filed: Aug. 26, 2011

(65) Prior Publication Data

US 2012/0058683 A1    Mar. 8, 2012

(30) Foreign Application Priority Data

Sep. 3, 2010  (JP) ................................. 2010-197896

(51) Int. Cl.
*H01R 13/62* (2006.01)
(52) U.S. Cl. ..................................... 439/331
(58) Field of Classification Search .................. 439/268, 439/331, 660, 217–219
See application file for complete search history.

(56) References Cited

U.S. PATENT DOCUMENTS

| | | | |
|---|---|---|---|
| 6,368,137 B1* | 4/2002 | Orwoll | 439/331 |
| 6,371,783 B1* | 4/2002 | Ohashi et al. | 439/268 |
| 6,743,043 B2* | 6/2004 | Yamada | 439/482 |
| 6,790,065 B2* | 9/2004 | Fukunaga | 439/266 |
| 2001/0024896 A1* | 9/2001 | Fukunaga | 439/266 |
| 2008/0050944 A1* | 2/2008 | Oda | 439/68 |

FOREIGN PATENT DOCUMENTS

JP    2004-342466    12/2004

* cited by examiner

*Primary Examiner* — Chandrika Prasad
(74) *Attorney, Agent, or Firm* — Staas & Halsey LLP

(57) ABSTRACT

A socket for an electrical part to prevent a bad electrical connection with a circuit by preventing a deformation of a tip of a contact pin. The contact pin of the present invention comprises one terminal contacts to a terminal of the electrical part and the other terminal contacts to the circuit. When a tip of the other terminal is pressed to a substrate under a state that first and second holes of first and second holding plates are shifted each other, an upper terminal of the held portion of the other terminal contacts to a lower surface of the second holding plate, and makes the second holding plate to separate from the first holding plate against a spring force of a urging member. At this time, the portion projecting from the lower surface of the first holding plate toward the substrate moves into the first hole.

11 Claims, 14 Drawing Sheets sliding direction

45°

45°

PRIOR ART

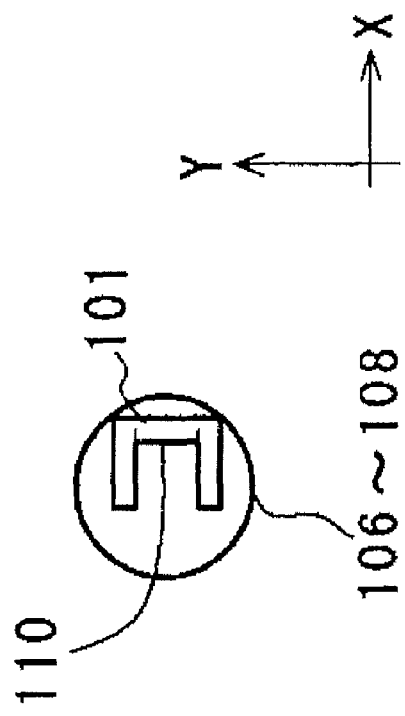
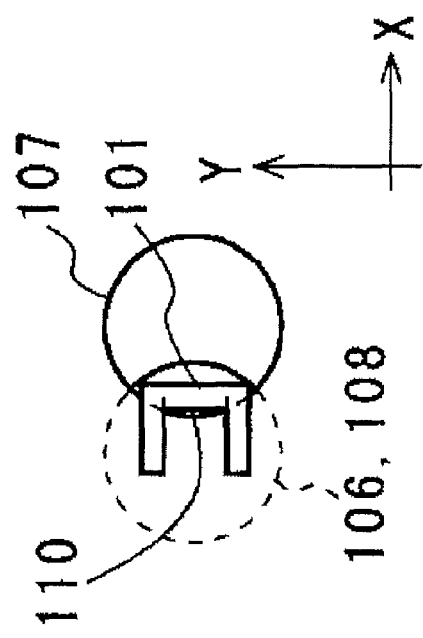

US 8,342,872 B2

SOCKET HAVING TWO PLATES FOR HOLDING CONTACT PINS AND AN URGING MEMBER FOR URGING THE PLATES TOGETHER

BACKGROUND OF THE INVENTION

1. Field of the Invention

The present invention relates to a socket for an electrical part that is used for burn-in test of an electrical part (e.g. an IC (Integrated Circuit) package), more particularly, relates to a socket for an electrical part used for an IC package of an LGA (Land Grid Array) type or BGA (Ball Grid Array) type.

2. Description of the Prior Art

Conventionally, the socket for an electrical part is known as a tool used in the processing for preventing the initial failure of an IC package (e.g. burn-in test).

Among the sockets for the electrical parts, the socket for an electrical part used in the burn-in test or other kinds of tests of the LGA type IC packages or the BGA type IC packages is constituted so as to be able to electrically connect the plural electrodes formed on the reverse surface of the IC package to an external electrical test circuit when the IC package is accommodated on the predetermined position of the socket body.

In addition, such socket for an electrical part comprises contact pins which are arranged so as to correspond with the electrodes of the IC package in one-to-one. For this, the contact pin holding holes corresponding to the pitch and the configuration state of the electrodes of the IC package are formed in the socket body in which contact pins are accommodated.

FIGS. 13A to 13E show the configuration for holding the contact pins 101 of such socket for the electrical part 100 (see Japanese Patent laid-Open Publication No. 2004-342466).

As shown in FIGS. 13A to 13E, the holding member 102 of the contact pins 101, which are a part of the socket body, are constituted by stacking three holding plates (i.e. first to third holding plates) 103-105, and, for inserting the contact pins 101, the holes 106-108 are formed so as to pass through the three holding plates 103-105 along the Z-axis direction (i.e. vertical direction). The holding plate 104 which lies midway among the three holding plates 103-105 (i.e. the second holding plate), is constituted so as to be able to move slidably against other two holding plates (i.e. the first holding plates 103 and the third holding plate 105), and so the holes 107 of the second holding plate 104 can be shifted against the holes 106 of the first holding plate 103 and the holes 108 of the third holding plate 105 (see FIGS. 13A to 13C).

According to such configuration of the contact pin 101, the holding member 102 receives the under terminals of the contact pins 101 under the state that the positions of the holes 106-108 of the three holding plates 103-105 correspond each other. When the engagement concave portions 110 formed at the lower side of the contact pins 101 moves inside the holes 106-108 to a position corresponding to the second holding plate 104 (see FIGS. 13D and 13E), the second holding plate 104 is moved slidably against the first and third holding plates 103 and 105, and is inserted into the engagement concave potions 110 (see FIGS. 13A to 13C). As a result, the inner surfaces of the holes 107 of the second holding plate 104 press the contact pins 101 against the inner surfaces of the holes 106 and 108 of the first and second holding plates 103 and 105. Therefore, the contact pins 101 are restrained from moving along the axis line direction of the holes 106-108 of the first to third holding plate 103-105 (i.e. z-axis direction), and additionally, rotational movement in the holes 106-108 of the first to third holding plate 103-105 (i.e. rotational movement along the X-Y plane) can be restricted. Consequently, the contact pins 101 are held by the first to third holding plate 103-105.

As shown in FIGS. 13A through 13E, according to the conventional socket 100 for the electrical part, the tips (i.e. lower terminal) of the contact pins 101 are projecting out from the lower surface of the first holding plate 103 constituting the socket body, and the tips of the contact pins 101 are engaged into the engagement holes of a substrate having an external electrical test circuit (not shown in Figures).

However, when such conventional socket 100 for the electrical part is mounted on the device employing the system to electrically connect the contact pins 101 and the external electrical test circuit by pressing the tips of the contact pins against the electrical terminals on the substrate, the tips of the contact pins 101 are deformed by the forces of screw clamps between socket body (which contains the first to third holding plate 103-105) and the substrate. Such deformation causes loose connections between the contact pins 101 and the substrate, and so may cause a bad electrical contact between the contact pins 101 and the external electrical test circuit.

SUMMARY OF THE INVENTION

An object of the present invention is to provide a socket for electrical part that prevents the deformation of the tips of contact pins (i.e. the tips for contacting the substrate), and prevents a bad electrical contact between the contact pins and the external electrical test circuit.

The present invention relates to a socket for an electrical part comprising a module accommodating a contact pin, in which one terminal of the contact pin is connected to a terminal of an IC package and the other terminal of the contact pin is connected to a circuit formed on a substrate; wherein the module comprises, a first holding plate which has a first hole to accommodate a held portion of the other terminal side of the contact pin so as to be vertically movable, a second holding plate which is disposed on the first holding plate so as to be vertically separative from the first holding plate and horizontally slidable from the first holding plate, and has a second hole to make the contact pin to be passed through, an urging member which urges the second holding plate toward the first holding plate, and a pushing-up portion which is formed at the held portion of the other terminal side so as to contact to the lower side of the second holding plate and separate the second holding plate from the first holding plate against an urging force of the urging member when a tip of the other side of the contact pin is pressed onto the substrate and the held portion of the other terminal side of the contact pin moves toward a direction in which the held portion buries in the first hole under a state the second hole of the second holding plate is shifted against the first hole of the first holding plate.

In the present invention, it is preferable that the socket for electrical part further comprises; a frame member which accommodates the module inside of it, and a pressing structure member which is mounted on the frame member and presses the terminal of the IC package to a tip of the one terminal of the contact pin.

In the present invention, it is preferable that the module further comprises a unit frame which is a frame member having a plane shape of just about a rectangle, and is fixed on the substrate, and the first holding plate is fixed on the unit frame so as to close an opening of a lower surface of the unit frame.

In the present invention, it is preferable that the socket for electrical part further comprises a floating plate which is disposed above the second holding plate via a space and has a hole to accommodate the one terminal of the contact pin.

In the present invention, it is preferable that the rotation of the contact pin is prevented by shifting the second hole of the second holding plate against the first hole of the first holding plate so as to pinch the contact pin between the inner surfaces of the first and second holes.

In the present invention, it is preferable that the urging member comprises a press spring and a spring receiving pin, the spring receiving pin comprises a shaft portion which is inserted into the press spring and a head portion which is contacted to an upper side end of the press spring, and the shaft portion inserted into the press spring is further inserted into a positioning hole of the second holding plate and a screw engagement hole of the first holding plate sequentially and screwed on a lower surface of the first holding plate.

In the present invention, it is preferable that the urging member comprises a compression spring in which one terminal of the compression spring urges the second holding plate downward and the other terminal of the compression spring urges the floating plate upward.

In the present invention, it is preferable that the contact pin comprises a transformed curve portion which is formed at an intermediate portion between the one terminal and the held portion of the other terminal so as to laterally inflect toward the straight line extended from the one terminal to the held portion of the lower terminal side.

In the present invention, it is preferable that the module further comprises a separation plate which is placed above the second holding plate so as to slide horizontally, the separation plate comprises a third hole, and the contact pin is inserted into the third hole so that the transformed curve portion is located near the third hole.

In the present invention, it is preferable that the terminal holding portion of the one terminal of the contact pin and the held portion of the other terminal are formed to just about a cylindrical geometries by rolling up a plane plates.

In the present invention, it is preferable that the pushing-up portion is a pushing-up projection which projects upward just about parallel to body portion of the held portion of the lower terminal side.

According to the present invention, when the tip of the contact pin is pressed to a substrate, the contact pin makes the second holding plate to separate from the first holding plate against the spring force of the urging member (e.g. the second holding plate pressing spring or the compression spring), and the part of the contact pin projecting out from the lower surface of the first holding plate toward the substrate moves into the first hole. Therefore, according to the present invention, the side of the contact pin connecting to the substrate (i.e. the other side of the contact pin) is prevented to be deformed. In addition, according to the present invention, the contact pin is surely pressed to the substrate by the spring force of the urging member, and so a bad electrical contact between the contact pins and the external electrical test circuit does not occur.

BRIEF DESCRIPTION OF THE DRAWINGS

Other objects and purposes of the present invention are described with referencing the following attached drawings.

FIG. 13C is a plane view of a structure shown in FIG. 13B.

FIG. 13E is a plane view of the structure shown in FIG. 13D.

DETAILED DESCRIPTION

Figure 1:
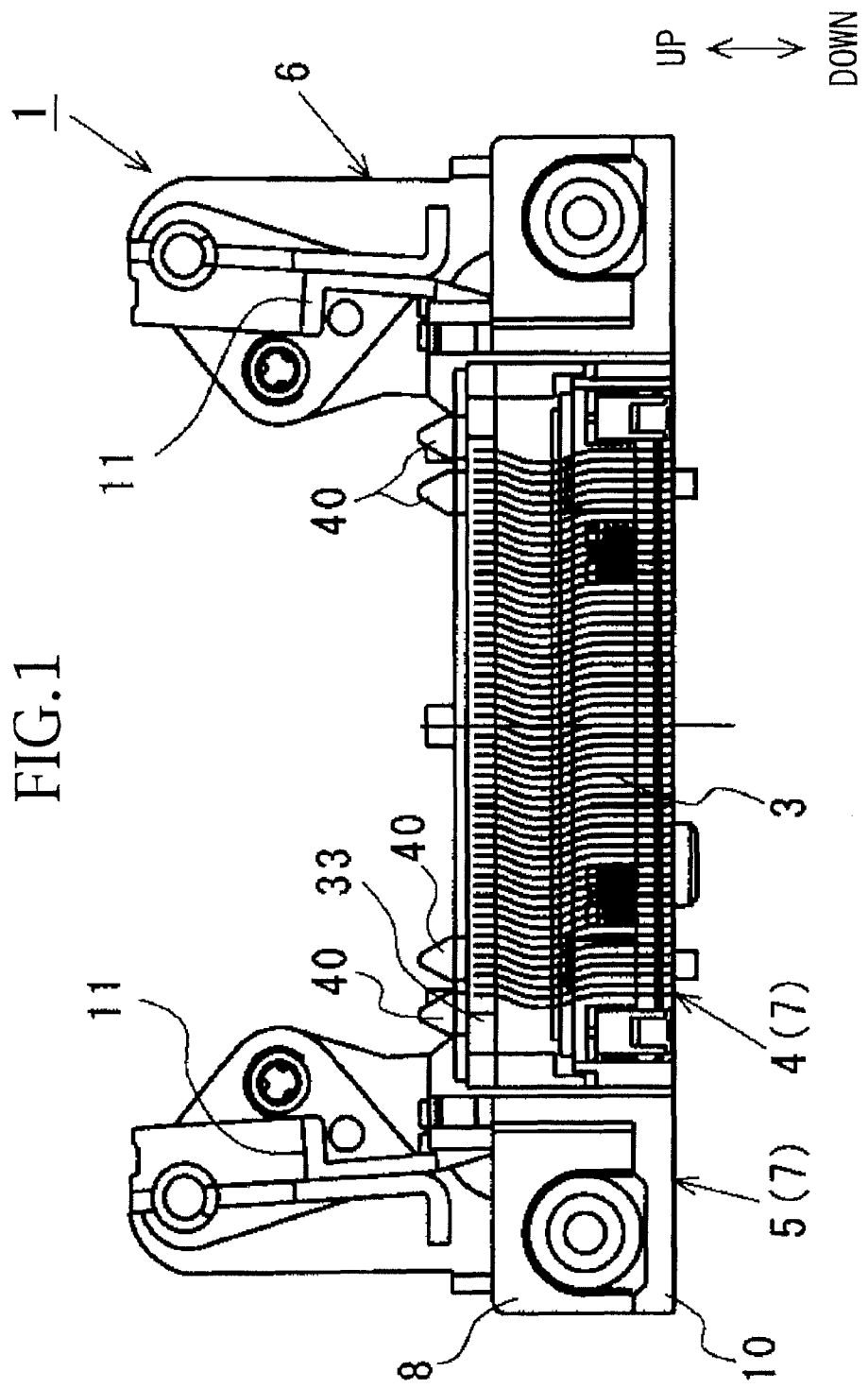
FIG. 1 is a front side cross-section view showing the socket for the electrical part according to the embodiment, and showing a state before mounting the IC package.

Hereinafter, a preferred embodiment according to the present invention is described with referencing drawings. In the drawings, the sizes, shapes of and positional relations between constituent element are only schematically shown to the extent that the present invention can be understood. Also, the numerical conditions that will be described hereinafter are simply exemplary conditions.

[Schematic Configuration of the Socket for Electrical Part]

Figure 2:
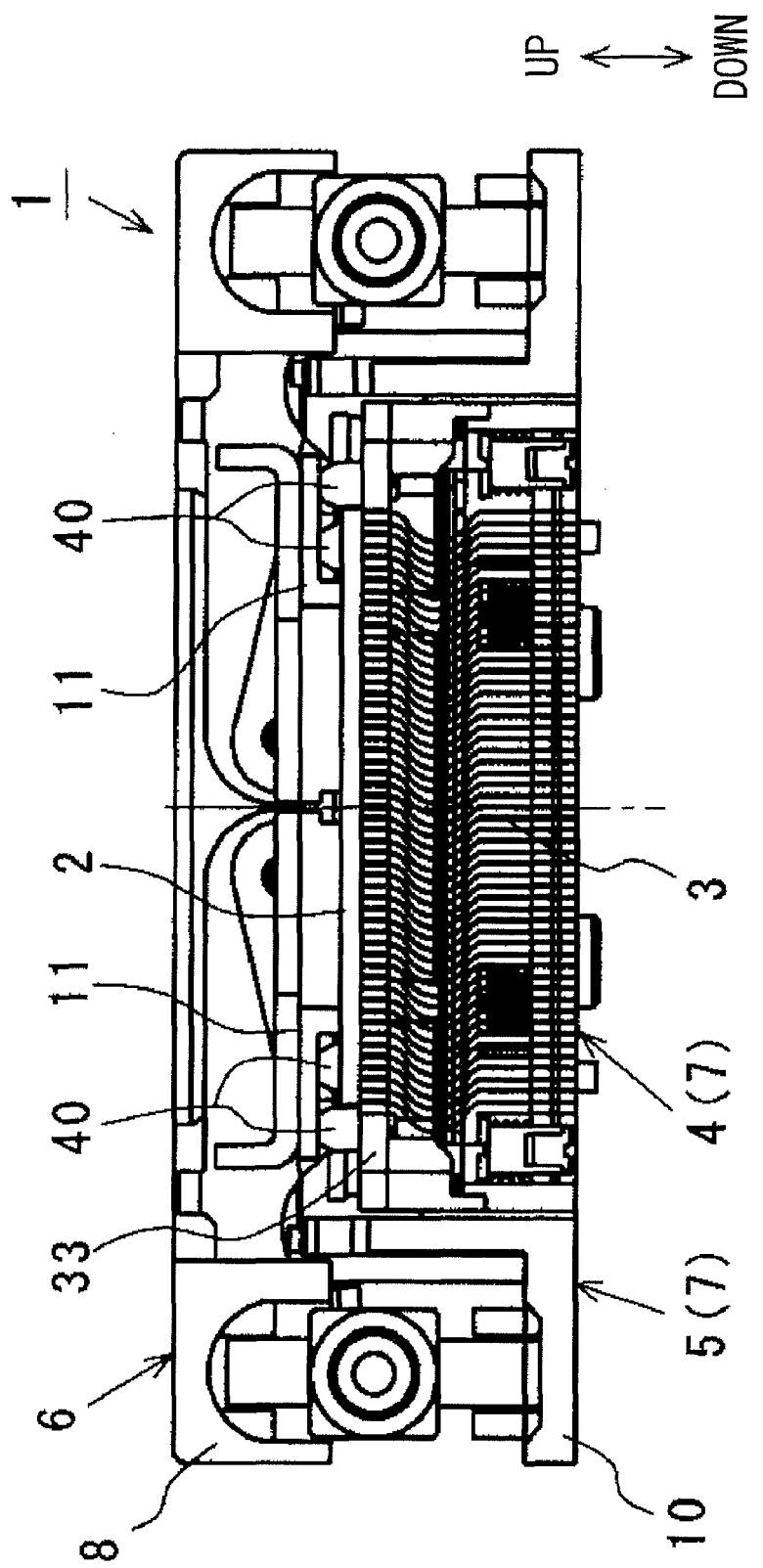
FIG. 2 is a front side cross-section view showing the socket for the electrical part according to the embodiment, and showing a state after mounting the IC package.
Figure 3:
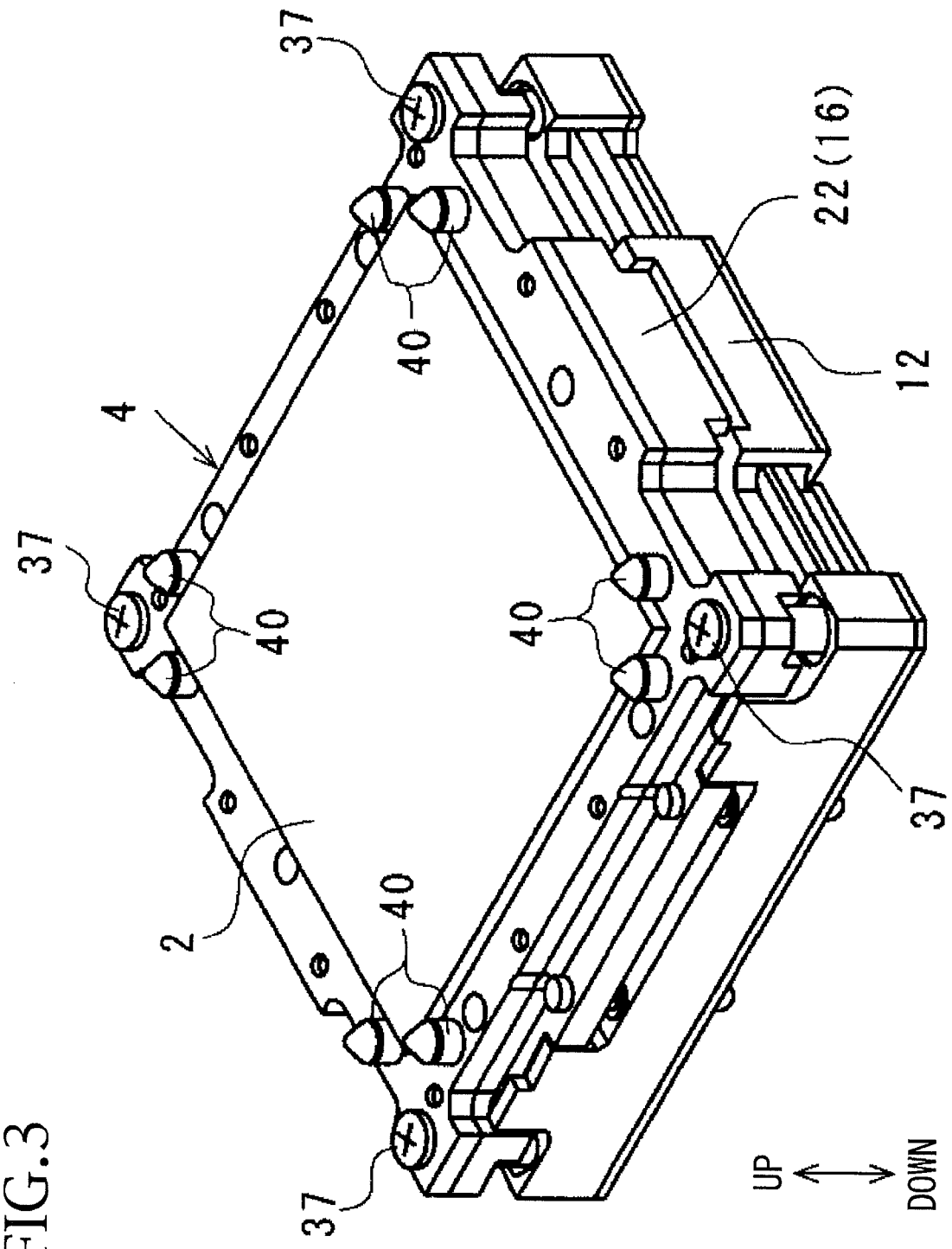
FIG. 3 is an appearance perspective view showing the module constituting the socket for the electrical part according to the embodiment.

FIGS. 1 and 2 show the socket 1 for electrical part according to the present embodiment, furthermore, show the socket 1 for electrical part used in burn-in test etc. for the IC package 2 of the LGA or BGA type. FIG. 1 is an elevation cross-section view showing the socket 1 for the electrical part in a state before mounting the IC package 2. FIG. 2 is an elevation cross-section view showing the socket 1 for the electrical part in a state after mounting the IC package 2.

As shown in these drawings, the socket 1 for the electrical part comprises the module 4 which holds plural contact pins 3 for electrically connecting the terminals of the IC package 2 and the external electrical test circuit (not shown in figures) of the substrate, the frame member 5 in which the module 4 is held and the press structure member 6 which is mounted on the frame member 5. The module 4 and the frame member 5 constitute the socket body 7.

[Press Structure Member]

Regarding the press structure member 6, when the operation frame 8 is pressed to the seating plate 10 of the frame member 5 by the arms of the automatic instrument not shown in figures, a pair of press plates 11 and 11 open against the urging forces which are generated by the press springs (not shown in figures) and act toward the closing direction of the press plates 11 and 11. Consequently, the IC package 2 can be mounted on the module 4 (see FIG. 1). Then, the IC package 2 is mounted on the module 4, the arms of the automatic instrument are evacuated and the operation frame 8 returns to the original position. As a result, the pair of press plates 11 and 11 closes by the urging forces of the press springs, in addition, the pair of press plates 11 and 11, which are urged toward the closing direction by the urging forces of the press springs, press the IC package 2 to the upper surface of the module 4 (see FIG. 2).

[Module]

Figure 4:
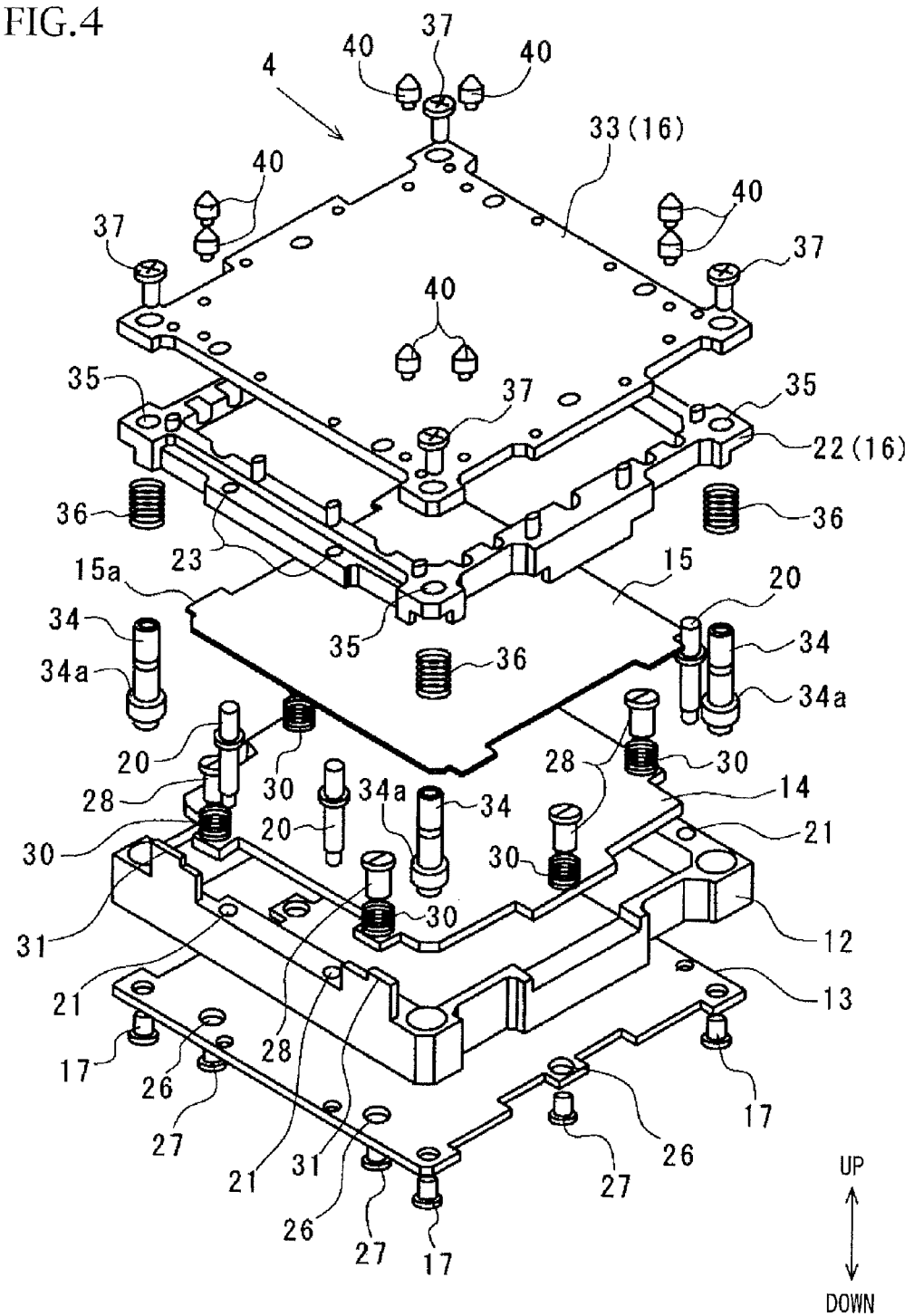
FIG. 4 is an exploded perspective view showing the module constituting the socket for the electrical part according to the embodiment.

As shown in FIGS. 1 to 7, the module 4 comprises the unit frame 12, the first holding plate 13, the second holding plate 14, the separation plate 15, the floating plate unit 16, contact pins 3 and so on. FIG. 4 is an exploded perspective view showing the module 4 with omitting the contact pins 3.

The unit frame 12 is a frame member, the plane shape of which is just about a rectangle. On the lower surface of the unit frame 12, four corner portions of the first holding plate 13 are fixed using screws 17. Consequently, the first holding plate 13 closes the lower side opening portion of the unit frame 12. The pin holes 21 are formed on two opposed sides of the unit frame 12. The positioning pins 20 are inserted into the pin holes 21. The positioning pins 20 project downward from the unit frame 12 and engaged with the positioning holes of the substrate 18 (see FIGS. 4 and 7). Moreover, the positioning pins 20, which are held by the unit frame 12, are inserted into the positioning hole 23 of the floating frame 22, which is located in the floating plate unit 16 described below, so as to be able to slide.

The first holding plate 13 comprises the first holes (e.g. circular holes) 24 passing through the obverse side and the reverse side. The number of the first holes 24 is same as the number of the contact pins 3. The held portions of the lower terminal side (that is, 'the held portions of the other terminal side' in the present invention) are inserted into the first holes 24 so as to be able to be slidable. The first holes 24 of the first holding plate 13 are omitted in FIG. 4.

Figure 8A:
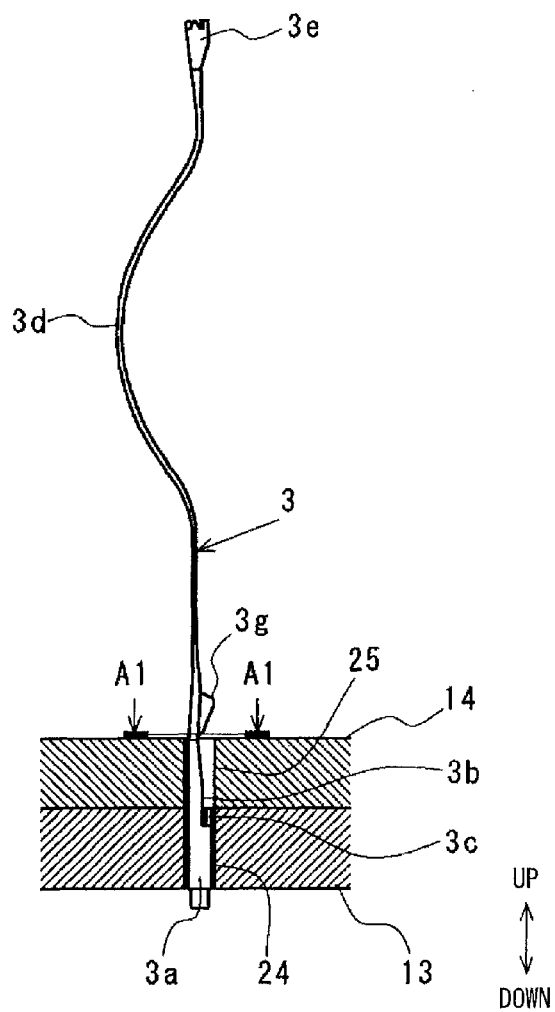
FIG. 8A is a view for describing the first step of the module manufacturing processing according to the embodiment, and is a cross-section view showing the structure for holding the lower terminals of the contact pins.
Figure 8B:
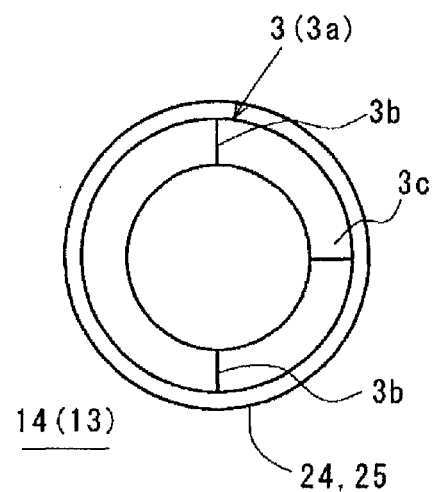
FIG. 8B is an enlarged plane view showing a cross-section configuration when the FIG. 8A is sectioned along the A1-A1 line.
Figure 9A:
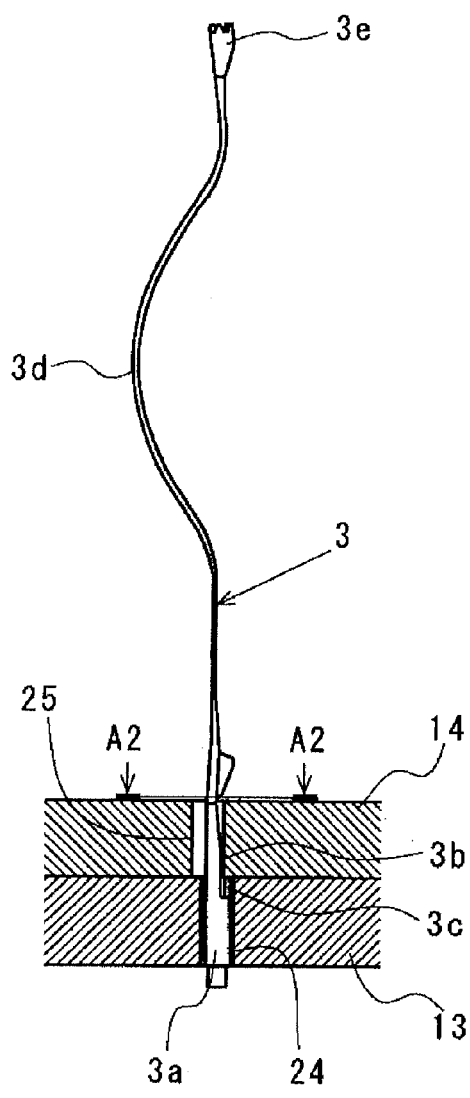
FIG. 9A is a view for describing the second step of the module manufacturing processing according to the embodiment, and is a cross-section view showing the structure for holding the lower terminals of the contact pins.
Figure 9B:
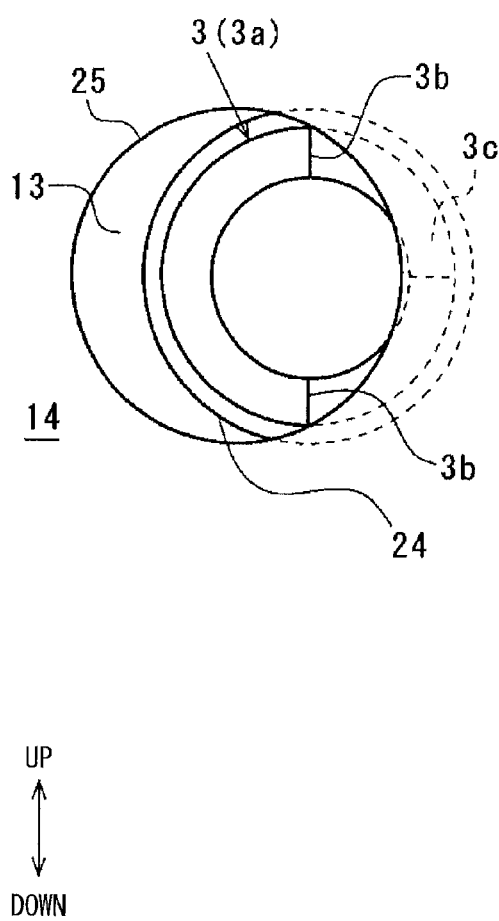
FIG. 9B is an enlarged plane view showing a cross-section configuration when the FIG. 9A is sectioned along the A2-A2 line.

The second holding plate 14 is located on the upper surface of the first holding plate 13 in the internal space of the unit frame 12. The second holding plate 14 is placed so as to be slidable against the unit flame 12 and the first holding plate 13. The size of the second holding plate 14 is decided so that spaces are left between the outer edges of it and the inner surface of the unit frame 12. In addition, the second holding plate 14 comprises the second holes (e.g. circular holes) 25 passing through between the obverse side and the reverse side. The size of the second holes 25 are same as the size of the first holes 24. The contact pins 3 are inserted into the second holding plate 14 under the state that the positions of the second holes 25 are adapted to the positions of the first holes 24 of the first holding plate 13 (see FIGS. 8A and 8B). The second holding plate 14 is made to be moved slidably after the held portions 3a of the lower terminal side of the contact pins 3 are inserted into the first holes 24. Consequently, the second holes 25 are shifted against the first holes 24 (see FIGS. 9A and 9B). Incidentally, on the upper side of the held portions 3a of lower terminal side of the contact pins 3, the anti-rotation portions 3b are formed with neighboring the held portions 3a of lower terminal side. When the second holding plate 14 is moved slidably, the anti-rotation portions 3b are pinched between the inner surfaces of the first and second holes 24 and 25 of the first and second holding plates 13 and 14. As a result, the rotation of the contact pins 3 in the first and second holes 24 and can be suppressed. In addition, when the second holding plate 14 is shifted against the first holding plate 13 as shown in FIGS. 9A and 9B, the positions of the positioning holes (not shown in figures) of the second holding plate 14 adjust to the positions of the screw engagement holes 26 of the first holding plate 13. Therefore, the shaft portion of the spring receiving pins 28, which are fixed to the first holding plate 13 using the screw 27, are engaged with the positioning holes with slight gaps.

The second holding plate pressing springs 30 are mounted between the upper surface of the second holding plate 14 and the head portions of the spring receiving pins 28. The second holding plate 14 is pressed to upper surface of the first holding plate 13 by the force of the second holding plate pressing springs 30. When the held portions 3a of lower terminal side of the contact pins 3 are raised upward inside the first holes 24 of the first holding plate 13, the pushing-up projection 3c, which are formed at the held portions 3a of lower terminal side of the contact pins 3, contact to the lower surface of the second holding plate 14, that is, opposing surface to the first holding plate 13. By this, the second holding plate pressing springs 30 are made to be shortened. Consequently, the held portions 3a of lower terminal side of the contact pins 3 makes the lower surface of the second holding plate 14 to leave from the upper surface of the first holding plate 13. The fall and rise of the second holding plate 14 are guided by the spring receiving pins 28. The spring receiving pins 28 are located at six places on the outer edge region surrounding the contact-pin-held-region of the second holding plate 14. The second holes 25 of the second holding plate 14 are omitted in FIG. 4.

On the upper surface of the unit frame 12, plural of the holding projection 31 are formed. The holding projections 31 hold the lower surface of the separation plate 15 so that the separation plate 15 can slide. The separation plate 15 is formed to have a plane shape of just about a rectangle. The separation plate 15 comprises the ligulae 15a which have rectangular geometries and formed so as to project from two opposing sides. The lower sides of the ligulae 15a are held by the holding projections 31 of the unit frame 12. Therefore, the separation plate 15 can move slidably in response to the transformation of the contact pins 3.

Figure 11B:
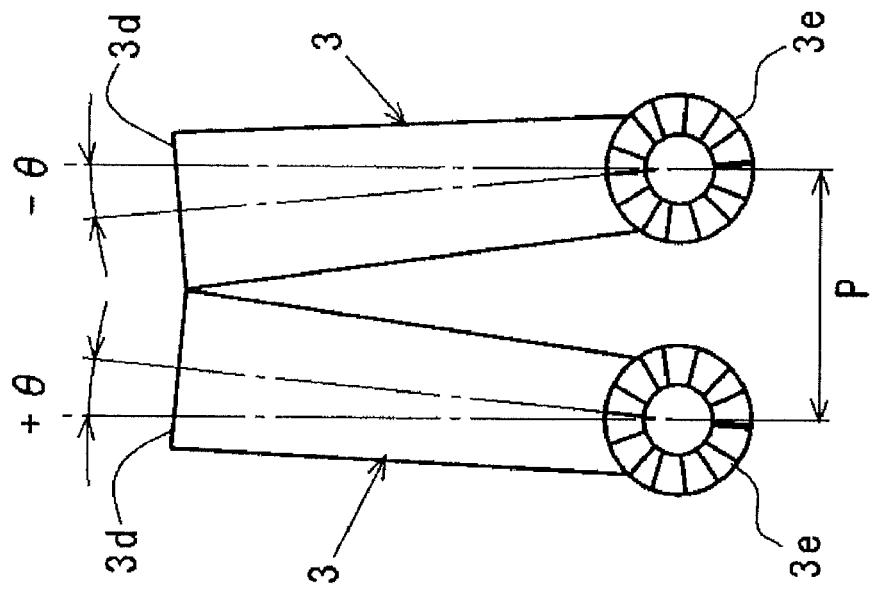
FIG. 11B is a conceptual diagram for describing a state of a failure occurrence when the separation plate is not used.
Figure 11A:
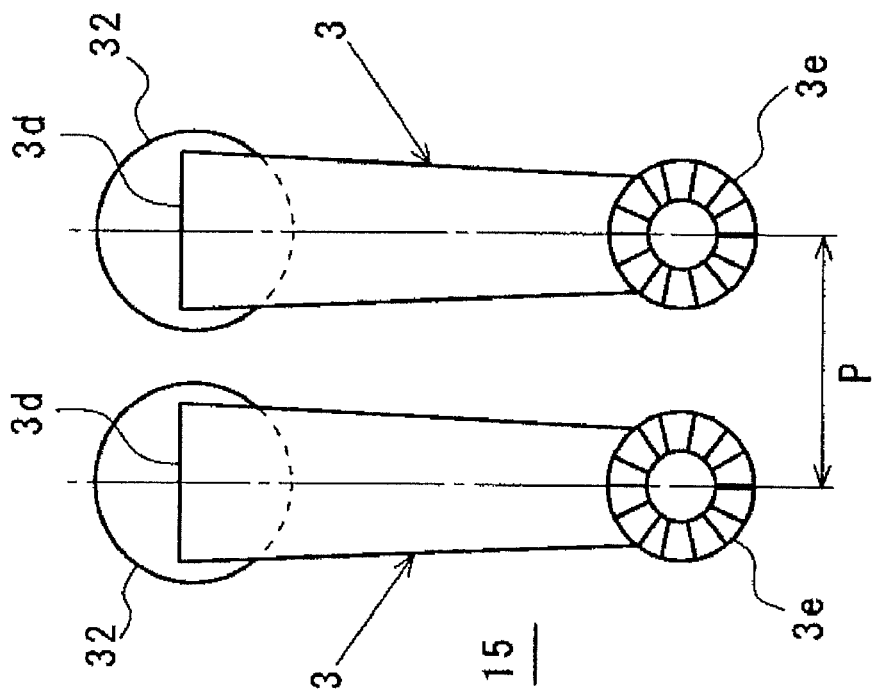
FIG. 11A is a conceptual diagram for describing the relationship between the contact pin and the separation plate according to the embodiment.

The separation plate 15 comprises the third holes (e.g. circular holes) 32 passing through the obverse side and the reverse side. The number of the third holes 32 is same as the number of the second holes 25. The transformed curve portions 3d are formed at the intermediate portion between the one terminal and the other terminal of the contact pins 3. The transformed curve portion 3d of the contact pins 3 are engaged with the third holes 32 with some gaps (see FIG. 11A). The contact pins 3 are inserted into the third holes 32. The third holes 32 are located at the same height as the portion slightly under the top of the transformed curve portion 3d (i.e. the most projecting portion in the transformed curve portion 3d), that is, the portion slightly nearer to the second holding plate 14 than the top of the transformed curve portion 3d. As a result, the adjacent contact pins 3 and 3 can be isolated each other, and so the contact of the adjacent contact pins 3 and 3 can be surely prevented. Incidentally, as shown in FIG. 9B, the present embodiment pinches the anti-rotation portions 3b of the contact pins 3 between the inner surfaces of the first and second holes 24 and 25 by shifting the second holes 25 against the first holes 24, and, by this, the present embodiment suppresses the rotation of the contact pins 3 inside the first and second holes 24 and 25. However, for making the contact pins 3 in the first and second holes 24 and 25 to be able to move slidably (i.e. move vertically), the slight gaps are made between inner surfaces of the first and second holes 24, 25 and the contact pins 3. Consequently, the contact pins 3 inside the first and second holes 24, 25 slightly rotate, (that is, the contact pins 3 rotate $+\theta$ or $-\theta$ of FIG. 11B). Therefore, when the pitch of the adjacent contact pins 3 and 3 is small and the separation plate 15 is not used, there is a risk that some kinds of electrical test cannot be executed because some contact pins 3 contact to the adjacent contact pins 3. For previously preventing the occurrence of such fault, the present embodiment surely prevents the connection between the adjacent contact pins 3 and 3 by engaging the transformed curve portion 3d of the contact pins 3 with the third holes 32 of the separation plate 15. The third holes 32 of the separation plate 15 are omitted in FIG. 4.

As described above, the present embodiment suppresses the rotation amount of the contact pins 3 inside the first and second holes 24 and 25 by making the inner surfaces of the first and second holes 24 and 25 to pinch the anti-rotation portions 3b of the contact pins 3 (see FIG. 9B). Consequently, the present embodiment can reduce the friction between the transformed curve portion 3d of the contact pin 3 and the inner surface of the third hole 32 of the separation plate 15 when the transformed curve portion 3d of the contact pin 3 deforms. Therefore, the present embodiment can prevent the inhibition of the movement of the contact pin 3, moreover, prevent the contact of the contact pins 3 for a long period of time.

The floating plate unit 16 comprises the floating frame 22 which is mounted on the unit frame 12 and the floating plate 33 which is fixed on the floating frame 22 for closing the opening portion of the upper side of the floating frame 22.

The floating frame 22 is a frame member having a plane shape of just about a rectangle. The guide holes 35 are formed at four corner portions of the floating frame 22. The shaft portions of the guide pins 34 are inserted into the guide holes 35 so as to move slidably. The floating springs 36 are engaged with guide pins 34. Slight gaps are formed between the guide pins 34 and the floating springs 36. The guide pins 34 comprise the bump surfaces 34a placed between the large-diameter portions and the shaft portions. The floating springs 36 are held by the bump surfaces 34a. As a result, the floating frame 22 is held by the floating springs 36 elastically. The floating plate 33 is stacked on the upper surface of the floating frame 22. Under such state, the stopper screws 37 are clamped to the internal threads formed on the upper end portion of the guide pins 34. Consequently, the floating plate 33 and the floating frame 22 are pressed to the heads of the stopper screws 37 by the urging forces of the floating springs 36. In the present embodiment, the position of height direction of the floating plate unit 16 is set by the position of the heads of the stopper screws 37 using such construction.

The contact pin positioning holes 38 are formed on the floating plate 33. The number of the contact pin positioning holes 38 is equal to the number of the first to third holes 24, 25 and 32. The contact pin positioning holes 38 accommodate the terminal holding portion 3e formed at one terminal of the contact pins 3 so as to slide. Each contact pin positioning hole 38 comprises the circular hole portion 38a which accommodates the terminal holding portion 3e formed at one terminal of the contact pins 3, additionally, comprises the contact-pin by-pass port portion 38b which is extended from the lower end of the circular hole portion 38a and has a tapered shape (see FIGS. 6 and 7). Incidentally, the contact-pin by-pass port portions 38b of the floating plate 33 are constituted so that the contact pins 3 except for the terminal holding portion 3e does not contact to the floating plate 33 even if the contact pins 3 change their posture.

A pair of the package guides 40 and 40 are mounted on the upper surface sides of each four corner portion of the floating plate 33. The package guides 40 and 40 are mounted so as to pinch each corner portion. The package guides 40 guide the IC package 2 to the predetermined position on the floating plate 33. As a result, the terminals formed at the lower surface side of the IC package 2 can be adapted to the tips of one terminal (i.e. the terminal holding portion 3e) of the contact pins 3 accommodated in the floating plate 33. The contact pin positioning holes 38 of the floating plate 33 are omitted in FIG. 4.

Figure 10A:
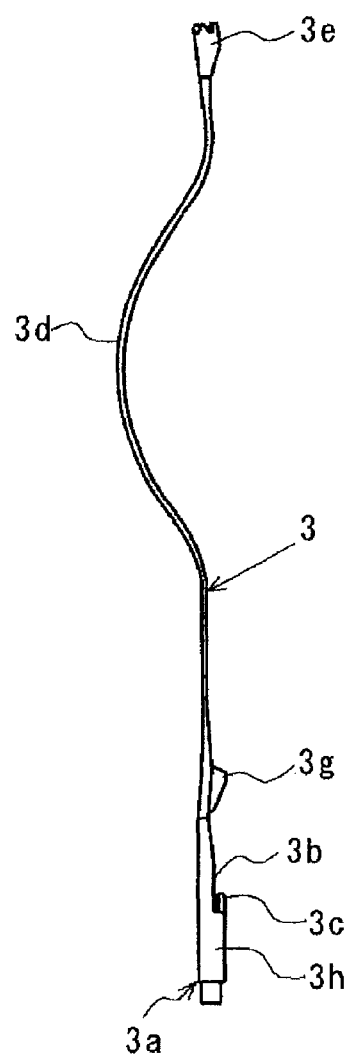
FIG. 10A is a side view showing the contact pin according to the embodiment.
Figure 10B:
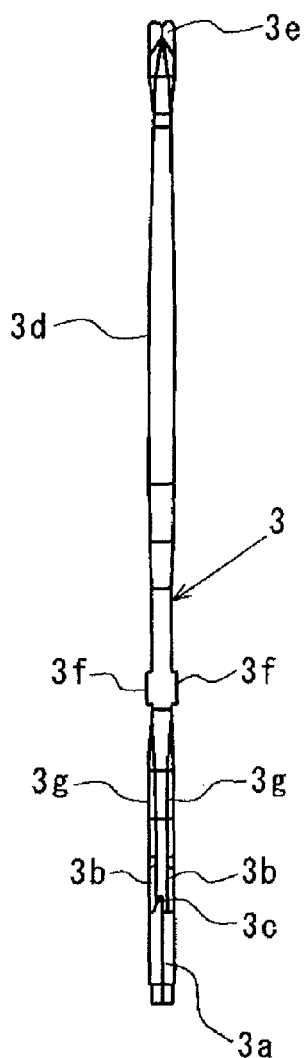
FIG. 10B is an elevation view showing the contact pin according to the embodiment.
Figure 10C:
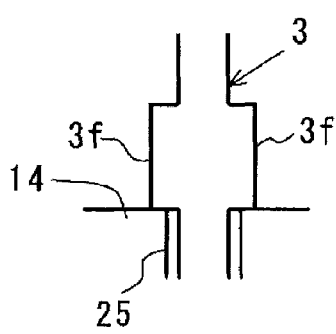
FIG. 10C is a partial enlarged view for describing a part of functions of the contact pin according to the embodiment.

The contact pin 3 is formed in an integrated manner by punching out a metallic plate having excellent conductivity and elasticity, as shown in FIG. 10A to 10C in detail. The terminal holding portion 3e of the contact pin 3 is formed to just about a cylindrical geometry by rolling up one terminal (i.e. upper terminal), and the held portion 3a of the lower terminal side of the contact pins 3 is formed to just about a cylindrical geometry by rolling up the other terminal (i.e. lower terminal). Consequently, the strength of the terminal holding portion 3e, which contacts to the IC package 2, can become higher, and the strength of the held portion 3a of the lower terminal side, which contacts to the substrate 18, can become higher. The pushing-up projection 3c is formed, projecting from the side of the upper portion of the held portion 3a of the lower terminal side of the contact pin 3 and is extended substantially parallel to the body portion 3h and the anti-rotation portions 3b of the held portion 3a of the lower terminal side. The transformed curve portion 3d of the contact pin 3 is formed by laterally inflecting the portion between the straight portion extended from the terminal holding portion 3e and the straight portion extended from the held portion 3a of the lower terminal side (that is, by laterally inflecting from the straight line extended from the terminal holding portion 3e to the held portion 3a of the lower terminal side). Consequently, the transformed curve portions 3d is deformed by the force having the direction for coming the terminal holding portions 3e and the held portions 3a of the lower side near each other. The projecting portions 3f are formed at the straight portions of the contact pins 3 between the held portions 3a of the lower terminal side and the transformed curve portions 3d. The projecting portion 3f cannot pass trough the second hole 25 of the second holding plate 14, and so can restrain the descending position of contact pin 3 against the second holding plate 14. The hole adjusting projection 3g of the contact pin 3 is formed between the projecting portion 3f and the anti-rotation portions 3b. The second hole 25 can be adapted to the first hole 24 by shifting the contact pin 3 to the lower side and engaging the hole adjusting projection 3g to the second hole 25 of the second holding plate 14 (see FIG. 8B).

Figure 5A:
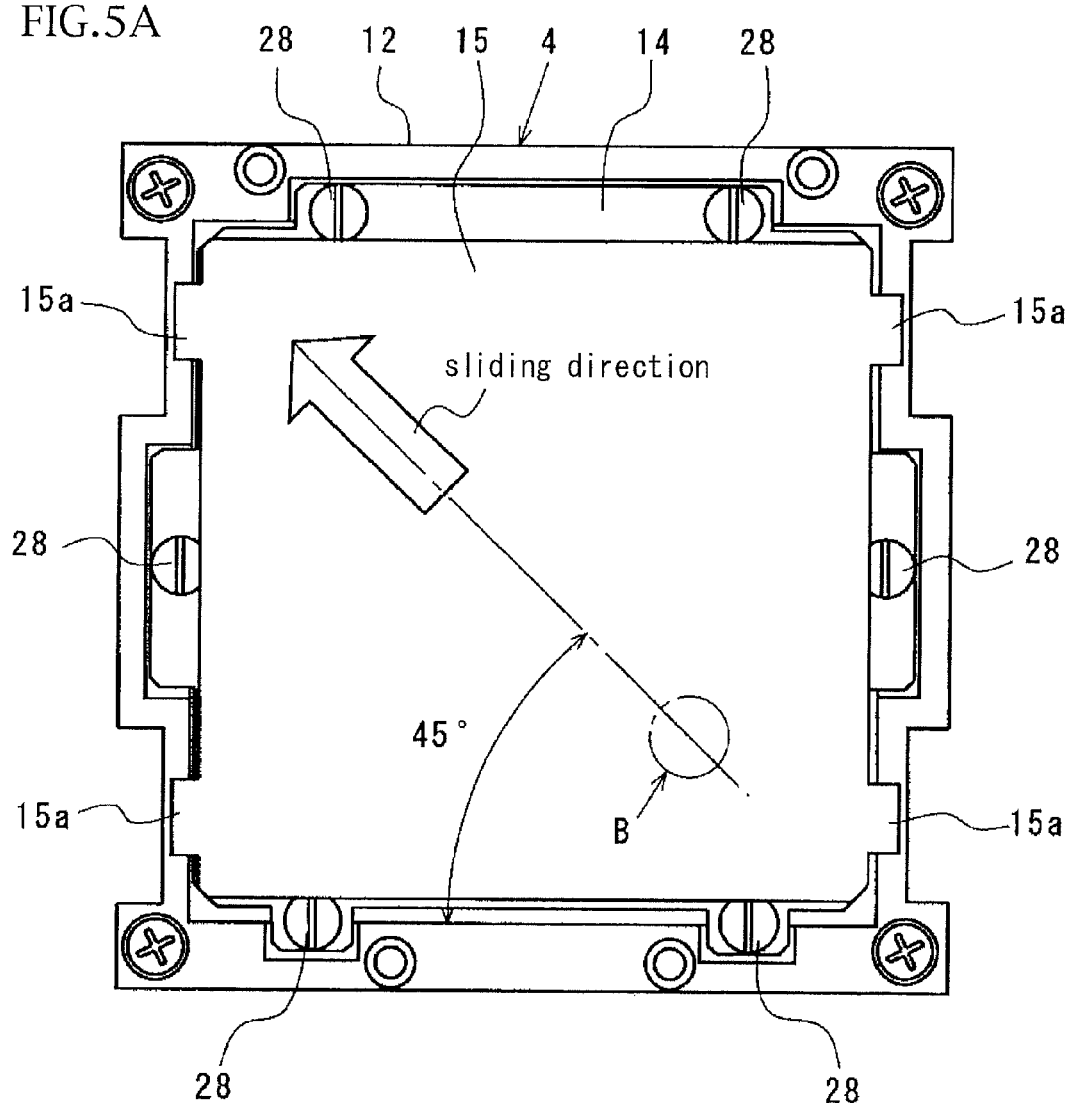
FIG. 5A is plane view showing a state that a part of component is dismounted from the module constituting the socket for the electrical part according to the embodiment.
Figure 5B:
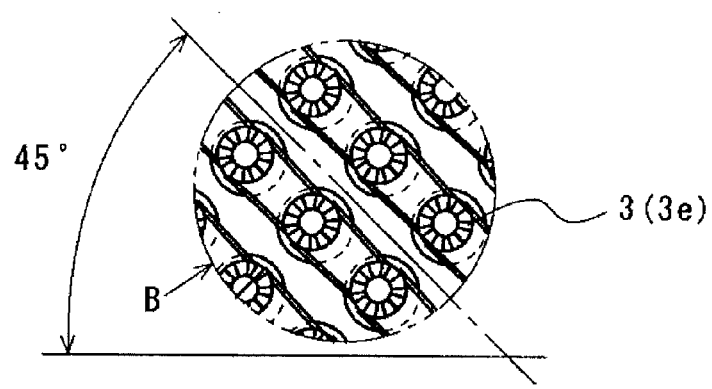
FIG. 5B is an enlarged view showing the part according to the symbol B on FIG. 5A.
Figure 6:
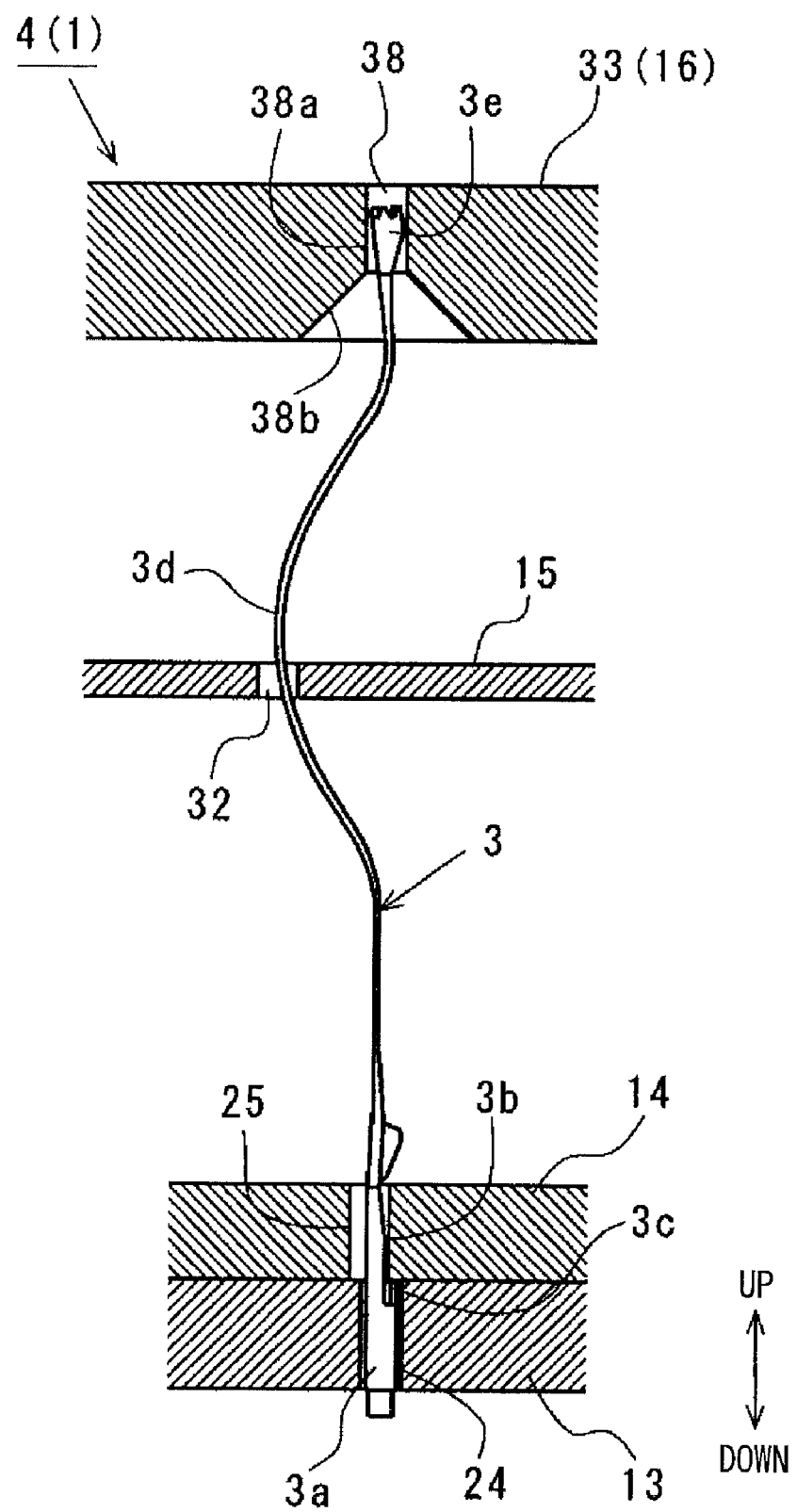
FIG. 6 is a cross-section view showing a structure for holding the contact pins in the module according to the embodiment, and showing a state before mounting the module onto the substrate.
Figure 7:
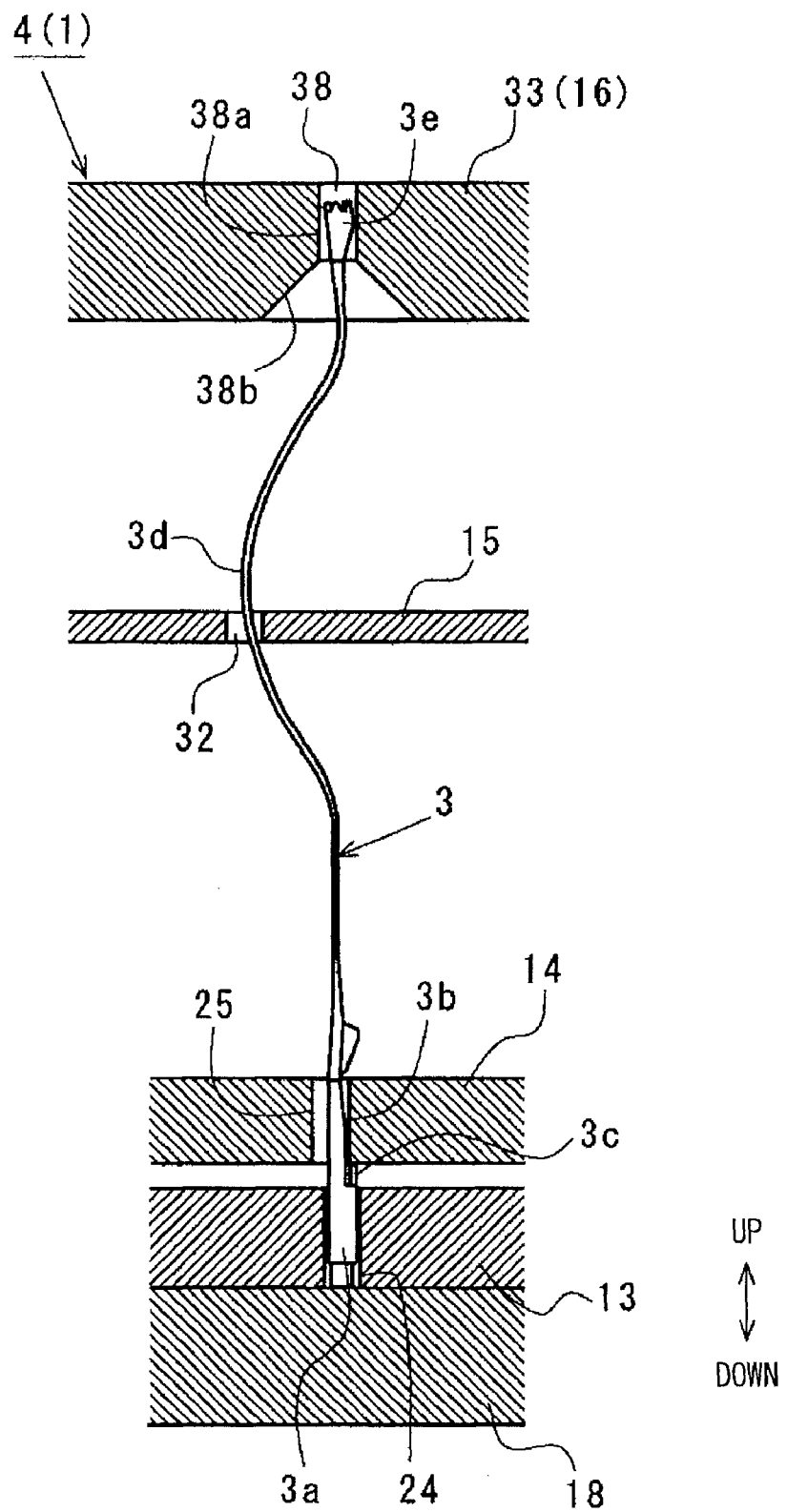
FIG. 7 is a cross-section view showing the structure for holding the contact pins in the module according to the embodiment, and showing a state after mounting the module onto the substrate.

When such formed contact pins 3 are accommodated by the first holding plate 13, the second holding plate 14 and the separation plate 15, the projecting directions of the transformed curve portions 3d are unified to the 45-degree from one side of the unit frame 12 (that is, diagonal direction) as shown in FIGS. 5A and 5B. In addition, when moving the second holding plate 14 by sliding it against the first holding plate 13, the moving direction is 45-degree from one side of the unit frame 12 (that is, diagonal direction).

Such formed contact pins 3 are contacted to the terminals of the IC packages 2 at the tips of one terminal side (i.e. the terminal holding portion 3e) and are pressed to the terminals of the external electrical test circuit at the tips of the other terminal side (i.e. the held portion 3a of the lower terminal side). As a result, the IC package 2 and the external electrical test circuit are connected electrically.

[Usage State of the Socket for the Electrical Part]

The socket 1 for the electrical part is fixed on the substrate 18 under the positioning state. As shown in FIG. 1, IC package 2 is mounted on the predetermined position of the floating plate 33 under the state a pair of the press plates 11 and 11 of the press structure member 6 are opened. Then, as shown in FIG. 2, the pair of the press plates 11 and 11 are closed, consequently, the pair of the press plates 11 and 11 urges the IC package 2 against the floating plate 33. As a result, the floating plate unit 16 goes down while contracting the floating spring 36. Then, the tips of the one terminals (i.e. the terminal holding portion 3e) of the contact pins 3 contact to the terminals of the IC package 2. When the contact pins 3 are pressed by the press plates 11 and 11 via the IC package 2, the transformed curve portions 3d deforms. As a result, the lower tips formed on the held portions 3a of the lower terminal side of the contact pins 3 are surely pressed to the terminals of the external electrical test circuit on the substrate 18 by the elastic forces of the second holding plate pressing springs 30 and the transformed curve portions 3d.

Additionally, when the unit frames 12 of the socket 1 for the electrical part is fixed to the substrate 18 via the first holding plate 13, the held portions 3a of the lower terminal side push up the second holding plate 14 against the urging force of the second holding plate pressing springs 30 and separate the second holding plate 14 from the first holding plate 13. Then, the held portions 3a of the lower terminal side of the contact pins 3 are pressed into the first holes 24 of the first holding plate 13. At this time, the contact pins 3 do not deform because of above mentioned mechanics, and so any bad connection do not occur between the held portions 3a of the lower terminal side and the terminals of the external electrical test circuit.

Technical Effect of the Present Embodiment

As described above, according to the socket 1 for electrical part of the present embodiment, the tips of the held portions 3a (that is, the tips of the pushing-up projection 3c) of the lower terminal side of the contact pins 3 separate the second holding plate 14 from the first holding plate 13 against the urging force of the second holding plate pressing springs 30 and the lower terminals of the contact pins 3 (that is, the portion projecting from the lower surface of the first holding plate 13 toward the substrate 18) move into the first holes 24, when the tips of the other side of the contact pins 3 (that is, the tips of the held portions 3a of the lower terminal side), which project from the lower surface of the first holding plate 13 toward the substrate 18, are pressed to the substrate 18. Therefore, the present embodiment can prevent the deformation of the contact pins 3, more particularly, the portion connecting to the substrate 18, and can surely press the contact pins 3 to the substrate 18 using spring forces of the second holding plate pressing springs 30. Consequently, according to the socket 1 for the electrical part of the present embodiment, bad electrical contact do not occur between the contact pins 3 and the external electrical test circuit.

Moreover, the socket 1 for the electrical part of the present embodiment can surely prevent the contact between adjacent contact pins 3 and 3 using the separation plate 15, and so can surely execute the electrical test of IC package 2.

The Modified Embodiment 1

Figure 12:
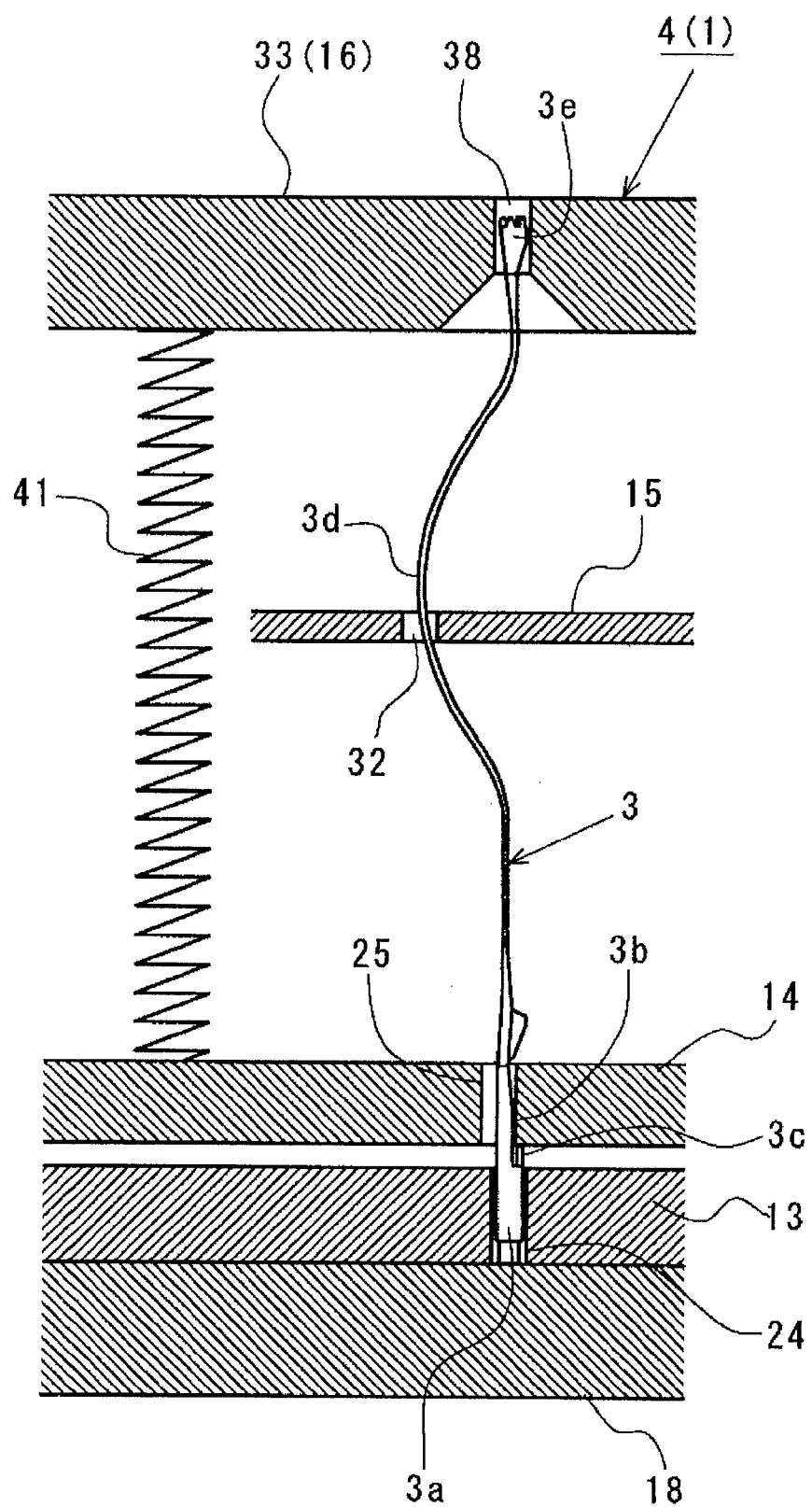
FIG. 12 is a cross-section view showing a structure for holding the contact pins in the module constituting the electrical part according to the modified embodiment 1 of the present invention.
Figure 13A:
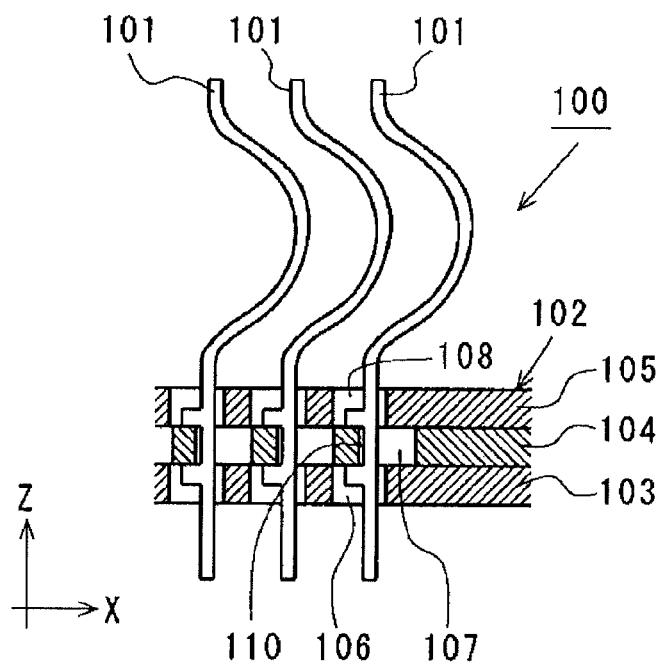
FIG. 13A is a cross-section view showing a structure for holding the contact pins according to a conventional art.
Figure 13B:
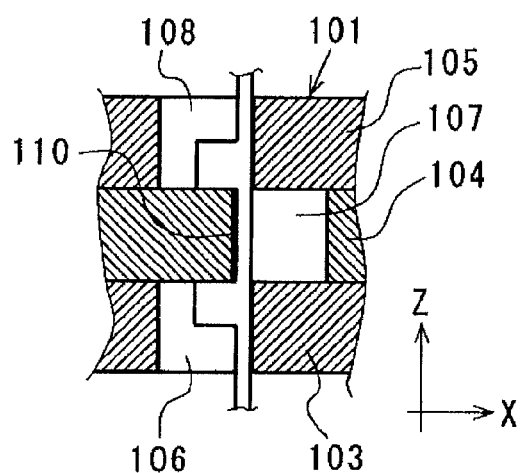
FIG. 13B is a cross-section view showing an enlarged part of FIG. 13A.
Figure 13D:
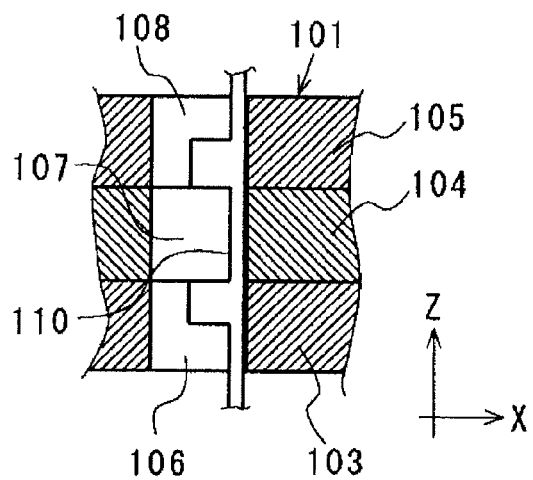
FIG. 13D is a conceptual diagram showing a state of a structure for holding the contact pins shown in FIG. 13A before being locked.

FIG. 12 is a cross-section diagram showing the modified embodiment 1 of the module 4. The module 4 according to the modified embodiment 1 is constituted so that the compression spring 41 does not interfere with the separation plate 15, and the compression spring 41 is pitched between the floating plate 33 and the second holding plate 14. Consequently, according to the modified embodiment 1, the spring force of the compression spring 41 acts in a direction to distance the floating plate unit 16 and the second holding plate 14. In other words, the modified embodiment 1 uses the compression spring 41 instead of the floating spring 36 and the second holding plate pressing springs 30 according to the above mentioned embodiment. The modified embodiment 1 can produce effects similar to the above mentioned embodiment.

The Modified Embodiment 2

The separation plate 15 of the module 4 can be omitted if the pitches P between contact pins 3 are large and so there is no risk that adjoining contact pins 3 and 3 contact each other.

What is claimed is:
1. A socket for an electrical part comprising a module accommodating a contact pin, in which one terminal of the contact pin is connected to a terminal of an IC package and the other terminal of the contact pin is connected to a circuit formed on a substrate;
wherein the module comprises,
a first holding plate which has a first hole to accommodate a held portion of the other terminal side of the contact pin so as to be vertically movable,
a second holding plate which is disposed on the first holding plate so as to be vertically separative from the first holding plate and horizontally slidable from the first holding plate, and has a second hole to make the contact pin to be passed through,
a urging member which urges the second holding plate toward the first holding plate, and
a pushing-up portion which is formed at the held portion of the other terminal side so as to contact to the lower side of the second holding plate and to separate the second holding plate from the first holding plate against a urging force of the urging member when a tip of the other side of the contact pin is pressed onto the substrate and the held portion of the other terminal side of the contact pin moves toward a direction in which the held portion bur- ies in the first hole under a state the second hole of the second holding plate is shifted against the first hole of the first holding plate.

2. The socket for an electrical part according to claim 1, further comprising;
   a frame member which accommodates the module inside of it, and
   a pressing structure member which is mounted on the frame member and presses the terminal of the IC package to a tip of the one terminal of the contact pin.

3. The socket for an electrical part according to claim 1, wherein;
   the module further comprises a unit frame which is a frame member having a plane shape of just about a rectangle, and is fixed on the substrate, and
   the first holding plate is fixed on the unit frame so as to close an opening of a lower surface of the unit frame.

4. The socket for an electrical part according to claim 1, further comprising a floating plate which is mounted above the second holding plate via a space and has a hole to accommodate the one terminal of the contact pin.

5. The socket for an electrical part according to claim 1, wherein the rotation of the contact pin is prevented by shifting the second hole of the second holding plate against the first hole of the first holding plate so as to pinch the contact pin between the inner surfaces of the first and second holes.

6. The socket for an electrical part according to claim 1, wherein;
   the urging member comprises a press spring and a spring receiving pin,
   the spring receiving pin comprises a shaft portion which is inserted into the press spring and a head portion which is contacted to an upper side end of the press spring, and the shaft portion inserted into the press spring is further inserted into a positioning hole of the second holding plate and a screw engagement hole of the first holding plate sequentially and screwed on a lower surface of the first holding plate.

7. The socket for an electrical part according to claim 4, wherein the urging member comprises a compression spring in which one terminal of the compression spring urges the second holding plate downward and the other terminal of the compression spring urges the floating plate upward.

8. The socket for an electrical part according to claim 1, wherein the contact pin comprises a transformed curve portion which is formed at an intermediate portion between the one terminal and the held portion of the other terminal so as to laterally inflect from the straight line extended from the one terminal to the held portion of the lower terminal side.

9. The socket for an electrical part according to claim 8, wherein;
   the module further comprises a separation plate which is placed above the second holding plate so as to slide horizontally,
   the separation plate comprises a third hole, and
   the contact pin is inserted into the third hole so that the transformed curve portion is located near the third hole.

10. The socket for an electrical part according to claim 1, wherein the terminal holding portion of the one terminal of the contact pin and the held portion of the other terminal are formed to just about a cylindrical geometries by rolling up plane plates.

11. The socket for an electrical part according to claim 1, wherein the pushing-up portion is a pushing-up projection which projects upward substantially parallel to body portion of the held portion of the lower terminal side.

* * * * *